(12) United States Patent
Lee et al.

(10) Patent No.: US 10,217,918 B2
(45) Date of Patent: Feb. 26, 2019

(54) LIGHT-EMITTING ELEMENT PACKAGE

(71) Applicant: LG INNOTEK CO., LTD., Seoul (KR)

(72) Inventors: Gun Kyo Lee, Seoul (KR); Kwang Hee Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 37 days.

(21) Appl. No.: 15/506,203

(22) PCT Filed: Aug. 20, 2015

(86) PCT No.: PCT/KR2015/008689
§ 371 (c)(1),
(2) Date: Feb. 23, 2017

(87) PCT Pub. No.: WO2016/032167
PCT Pub. Date: Mar. 3, 2016

(65) Prior Publication Data
US 2018/0226552 A1    Aug. 9, 2018

(30) Foreign Application Priority Data

Aug. 26, 2014 (KR) .................. 10-2014-0111389
Sep. 16, 2014 (KR) .................. 10-2014-0122516

(51) Int. Cl.
*H01L 33/62* (2010.01)
*H01L 33/50* (2010.01)
(Continued)

(52) U.S. Cl.
CPC .............. *H01L 33/62* (2013.01); *H01L 24/48* (2013.01); *H01L 25/0753* (2013.01);
(Continued)

(58) Field of Classification Search
CPC ....... H01L 33/62; H01L 33/505; H01L 33/56; H01L 33/30; H01L 33/32; H01L 33/647
See application file for complete search history.

(56) References Cited

U.S. PATENT DOCUMENTS

2011/0096560 A1* 4/2011 Ryu .................... C09K 11/0883
362/510
2012/0319150 A1* 12/2012 Shimomura .......... H01L 33/486
257/98
(Continued)

FOREIGN PATENT DOCUMENTS

JP        2013-077727       4/2013
KR   10-2008-0023809       3/2008
(Continued)

OTHER PUBLICATIONS

International Search Report (with English Translation) and Written Opinion dated Nov. 27, 2015 issued in Application No. PCT/KR2015/008689.

*Primary Examiner* — Joseph Galvin, III
(74) *Attorney, Agent, or Firm* — Ked & Associates, LLP

(57) ABSTRACT

A light-emitting element package according to an embodiment comprises: a substrate; a conductive layer arranged on the substrate; at least one light-emitting chip arranged on the substrate; a wire for electrically connecting the conductive layer and the at least one light-emitting chip; a wavelength conversion unit arranged on the light-emitting chip; and a molding unit arranged on the substrate so as to enclose the light-emitting chip and the wire and to expose the upper surface of the wavelength conversion unit, wherein the distance from the upper surface of the light-emitting chip to the upper surface of the wavelength conversion unit is larger than a value obtained by adding 37 μm to the distance from the upper surface of the light-emitting chip to the highest point of the wire.

20 Claims, 12 Drawing Sheets

(51) Int. Cl.
    *H01L 33/52*         (2010.01)
    *H01L 23/00*         (2006.01)
    *H01L 25/075*       (2006.01)
    *H01L 33/56*         (2010.01)
    *H01L 33/08*         (2010.01)
    *H01L 33/30*         (2010.01)
    *H01L 33/32*         (2010.01)
    *H01L 33/64*         (2010.01)

(52) U.S. Cl.
    CPC ............ H01L 33/50 (2013.01); H01L 33/505 (2013.01); H01L 33/52 (2013.01); H01L 33/56 (2013.01); *H01L 24/85* (2013.01); *H01L 33/08* (2013.01); *H01L 33/30* (2013.01); *H01L 33/32* (2013.01); *H01L 33/647* (2013.01); *H01L 2224/48091* (2013.01); *H01L 2224/48106* (2013.01); *H01L 2224/48247* (2013.01); *H01L 2224/8592* (2013.01); *H01L 2924/12041* (2013.01); *H01L 2924/181* (2013.01); *H01L 2924/19107* (2013.01); *H01L 2933/005* (2013.01); *H01L 2933/0041* (2013.01); *H01L 2933/0066* (2013.01)

(56) References Cited

U.S. PATENT DOCUMENTS

| | | | |
|---|---|---|---|
| 2013/0221509 A1* | 8/2013 | Oda | H01L 24/97 257/676 |
| 2014/0048766 A1* | 2/2014 | Chu | H01L 33/505 257/13 |
| 2014/0209947 A1* | 7/2014 | Cho | H01L 25/0753 257/98 |
| 2016/0111611 A1* | 4/2016 | Yoshida | C08K 3/013 257/98 |

FOREIGN PATENT DOCUMENTS

| KR | 10-2010-0131756 | 12/2010 |
|---|---|---|
| KR | 10-2013-0007276 | 1/2013 |
| KR | 10-2014-0096722 | 8/2014 |

* cited by examiner

LIGHT-EMITTING ELEMENT PACKAGE

CROSS-REFERENCE TO RELATED PATENT APPLICATIONS

This application is a U.S. National Stage Application under 35 U.S.C. § 371 of PCT Application No. PCT/KR2015/008689, filed Aug. 20, 2015, which claims priority to Korean Patent Application No. 10-2014-0111389, filed Aug. 26, 2014, and Korean Patent Application No. 10-2014-0122516, filed Sep. 16, 2014, whose entire disclosures are hereby incorporated by reference.

TECHNICAL FIELD

Embodiments relate to a light emitting element package.

BACKGROUND ART

Light emitting elements, such as light emitting diodes (LED) or laser diodes (LD), which use group III-V or II-VI compound semiconductor materials, are capable of emitting visible light of various colors, such as red, green and blue, and ultraviolet light owing to development of element materials and thin film growth techniques, are also capable of emitting white light with high luminous efficacy through use of a fluorescent substance or by combining colors, and have several advantages, namely low power consumption, semi-permanent lifespan, fast response speed, safety, and environmental friendliness, as compared to conventional light sources, such as fluorescent lamps and incandescent lamps.

Accordingly, application of the light emitting elements has been extended to transmission modules of optical communication means, light emitting diode backlights to replace Cold Cathode Fluorescent Lamps (CCFL) which serve as backlights of Liquid Crystal Display (LCD) apparatuses, white light emitting diode lighting apparatuses to replace fluorescent lamps or incandescent lamps, vehicle head lamps, and traffic lights.

Light emitting element packages are widely used in lighting apparatuses or display apparatuses. A light emitting element package may generally include a body, lead frames located within the body, and a light emitting element (for example, an LED) located on any one of the lead frames.

DISCLOSURE

Technical Problem

Embodiments provide a light emitting element package which may prevent wires from being damaged due to external impact and being oxidized, improve reliability in wire bonding and achieve high contrast between turning-on and turning-off.

Technical Solution

In one embodiment, a light emitting element package includes a substrate, a conductive layer disposed on the substrate, at least one light emitting chip disposed on the substrate, a wire configured to conductively connect the conductive layer and the at least one light emitting chip, a wavelength conversion unit disposed on the at least one light emitting chip, and a molding part disposed on the substrate so as to enclose the at least one light emitting chip and the wire and to expose an upper surface of the wavelength conversion unit, wherein a distance from the upper surface of the at least one light emitting chip to the upper surface of the wavelength conversion unit is greater than a value acquired by adding 37 μm to a distance from the upper surface of the at least one light emitting chip to a highest point of the wire.

The distance from the upper surface of the at least one light emitting chip to the upper surface of the wavelength conversion unit may be greater than a distance from the upper surface of the at least one light emitting chip to an upper surface of the molding part.

The distance from the upper surface of the at least one light emitting chip to the highest point of the wire may be smaller than a distance from the upper surface of the at least one light emitting chip to an upper surface of the molding part.

The wavelength conversion unit may enclose one end of the wire bonded to the at least one light emitting chip.

The molding part may contact the side surface of the wavelength conversion unit. The highest point of the wire may be aligned with the boundary between a side surface of the wavelength conversion unit and the molding part.

The molding part may contact a corner part where the upper surface of the wavelength conversion unit and a side surface of the wavelength conversion unit meet.

The molding part may be spaced apart from a corner part where the upper surface of wavelength conversion unit and a side surface of the wavelength conversion unit meet. The wavelength conversion unit may protrude from an upper surface of the molding part.

The distance from the upper surface of the at least one light emitting chip to the highest point of the wire may be 67 μm or more.

In another embodiment, a light emitting element package includes a substrate, a conductive layer disposed on the substrate, at least one light emitting chip disposed on the substrate, a wavelength conversion unit disposed on the upper surface of the at least one light emitting chip and having a through hole, a wire provided with one end passing through the through hole and connected to the at least one light emitting chip and the other end connected to the conductive layer, and a molding part disposed on the substrate so as to enclose the at least one light emitting chip and the wire, wherein the molding part contacts a side surface of the wavelength conversion unit and exposes an upper surface of the wavelength conversion unit.

A distance from the upper surface of the at least one light emitting chip to the upper surface of the wavelength conversion unit may be greater than a value acquired by adding 37 μm to a distance from the upper surface of the at least one light emitting chip to a highest point of the wire.

The wavelength conversion unit may be spaced apart from the end of the wire connected to the at least one light emitting chip.

The molding part may enclose the end of the wire connected to the at least one light emitting chip and contact the end of the wire.

The molding part may fill an inside of the through hole of the wavelength conversion unit.

In yet another embodiment, a light emitting element package includes lead frames, light emitting elements disposed on the lead frames, phosphor plate disposed on an upper surface of each of the light emitting elements, wires configured to conductively connect the light emitting elements and the lead frames, and a resin layer configured to enclose the lead frames, the light emitting elements, the phosphor plates and at least parts of the wires, wherein the resin layer exposes the upper surfaces of the phosphor plates disposed on upper surfaces of the light emitting elements, contacts side surfaces of the phosphor plates, is disposed between side surfaces of the lead frames and contacts the side surfaces of the lead frames.

Each of the light emitting elements may be disposed on the upper surface of a corresponding one of the lead frames, and the resin layer may expose lower surfaces of the lead frames.

A height of an upper surface of the resin layer may be greater than a height of the highest point of the wire.

A distance from the upper surface of each of the light emitting elements to the upper surface of the resin layer may be the same as a distance from the upper surface of each of the light emitting element to the upper surface of each of the phosphor plates.

The resin layer may be formed of a black resin, Polyphthalamide (PPA) resin mixed with carbon black, black Epoxy Molding compound (EMC) resin or black silicone.

Advantageous Effects

Embodiments provide a light emitting element package which may prevent wires from being damaged due to external impact and being oxidized, improve reliability in wire bonding and achieve high contrast between turning-on and turning-off.

BEST MODE

Figure 1:
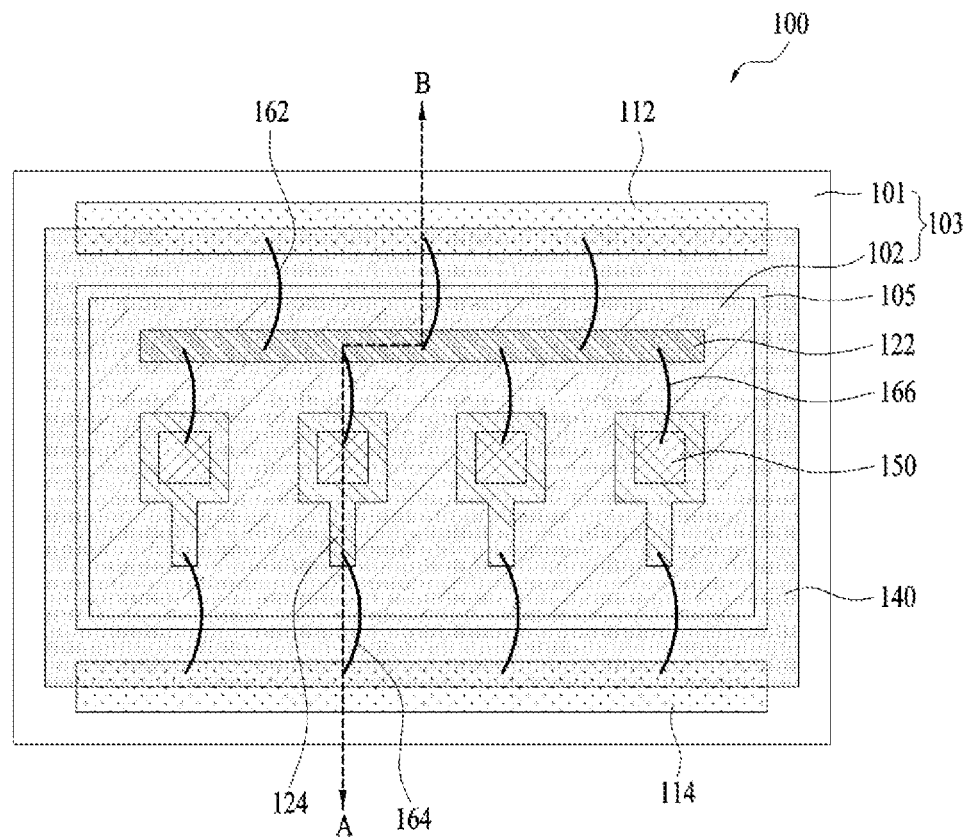
FIG. 1 is a plan view of a light emitting element package in accordance with one embodiment.

Hereinafter, embodiments will be apparently described with reference to the annexed drawings and description. In the following description of the embodiments, it will be understood that, when each layer (film), region, pattern or structure is referred to as being formed "on" or "under" a substrate, another layer (film), region, pad or pattern, it can be directly "on" or "under" the other element or be indirectly formed with one or more intervening elements therebetween. In addition, it will also be understood that "on" or "under" the element may be described based on the drawings.

In the drawings, the sizes of respective elements may be exaggerated, omitted, or schematically illustrated for convenience and clarity of description. Further, the sizes of the respective elements do not indicate actual sizes thereof. Additionally, the same or similar elements are denoted by the same reference numerals even though they are depicted in different drawings.

Figure 2:
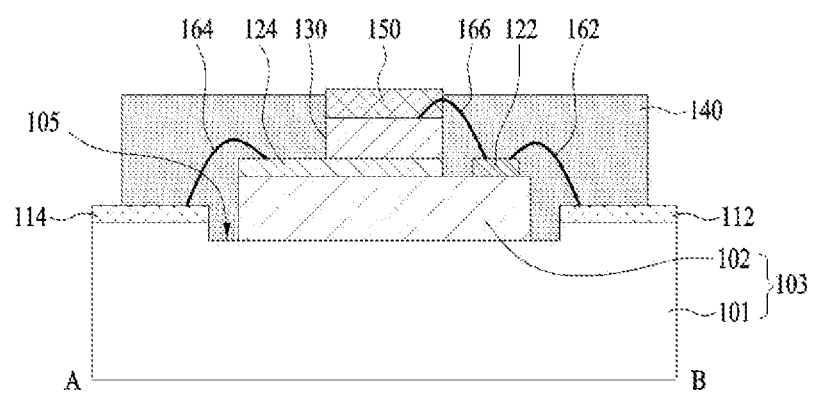
FIG. 2 is a cross-sectional view taken along line A-B of the light emitting element package shown in FIG. 1.

FIG. 1 is a plan view of a light emitting element package 100 in accordance with one embodiment, and FIG. 2 is a cross-sectional view taken along line A-B of the light emitting element package 100 shown in FIG. 1.

With reference to FIGS. 1 and 2, the light emitting element package 100 includes a substrate 103, a plurality of conductive layers 112, 114, 122 and 124, at least one light emitting chip 130, a molding part 140, and a wavelength conversion unit 150, and wires 162, 164 and 166.

The conductive layers 112, 114, 122 and 124 are disposed on the substrate 103, and the at least one light emitting chip 130 is disposed on the substrate 103. In another embodiment, the term "substrate" 103 may be replaced with the term "package body".

The substrate 103 may include at least one of a first substrate 101 and a second substrate 102.

For example, the substrate 103 may include the first substrate 101 and the second substrate 102 disposed on the first substrate 101, and the area of the second substrate 102 may be less than the area of the first substrate 101. In another embodiment, the area of the second substrate 102 may be equal to the area of the first substrate 101.

The first substrate 101 may be a substrate having first thermal conductivity, the second substrate 102 may be a substrate having second thermal conductivity, and the first thermal conductivity may be greater than the second thermal conductivity. The reason for this is to rapidly discharge heat, generated from the light emitting chip 130 disposed on the second substrate 102, to the outside through the first substrate 101.

The first substrate 101 may be a metal substrate, for example, a Metal Core Printed Circuit Board (MCPCB). The first substrate 101 may be a heat dissipation plate formed of one selected from the group consisting of copper (Cu), aluminum (Al), silver (Ag) and gold (Au), or an alloy thereof.

The second substrate 102 may be an insulating substrate. For example, the second substrate 102 may be a ceramic substrate having high thermal conductivity. The second substrate 102 may be formed of a nitride, for example, AlN. Further, the second substrate 102 may include an anodized layer.

The first substrate 101 and the second substrate 102 may be formed to have various shapes.

In accordance with one embodiment, the first substrate 101 may have a cavity 105 in a designated region, and the second substrate 102 may be disposed in the cavity 105 of the first substrate 101. Here, the first substrate 101 may include at least one of Al, Cu and Au, and the second substrate 102 may include AlN.

In accordance with another embodiment, the first substrate 101 and the second substrate 102 may be sequentially stacked and thus form a laminating structure. Here, the first substrate 101 may include at least one of Al, Cu and Au, and the second substrate 102 may include an anodized layer.

In accordance with yet another embodiment, the first substrate 101 and the second substrate 102 may be formed of the same material, for example, the first substrate 101 and the second substrate 102 may include at least one of AlN, Al, Cu and Au.

The upper surface of the second substrate 102 on which the light emitting chip 130 is disposed may be flat or curved, such as concave or convex. Otherwise, the upper surface of the second substrate 102 may have a combination shape in which at least two of a flat surface, a concave surface and a convex surface are combined.

The first conductive layer 122 and the second conductive layers 124 may be disposed on the second substrate 102 so as to be spaced apart from each other. Further, since the second substrate 102 is an insulating substrate, the first conductive layer 122 and the second conductive layers 124 may be conductively isolated. Further, in accordance with another embodiment, an insulating layer (not shown) may be disposed between the first substrate 101 and the first conductive layer 122 and between the first substrate 101 and the second conductive layers 124. The second substrate 102 may include a second circuit pattern including the first conductive layer 122 and the second conductive layers 124.

The third conductive layer 112 and the fourth conductive layer 114 may be disposed on the first substrate 101 so as to be spaced apart from each other. Further, the third conductive layer 112 and the fourth conductive layer 114 may be conductively isolated from each other and, for the purpose of electrical isolation, an insulating layer (not shown) may be disposed between the first substrate 101 and the third conductive layer 112 and between the first substrate 101 and the fourth conductive layer 114.

The first substrate 101 may include a first circuit pattern including the third conductive layer 112 and the fourth conductive layer 114. The first to fourth conductive layers 122, 124, 112 and 114 are not limited to the shapes shown in FIG. 1 and may have various shapes.

The at least one light emitting chip 130 may be disposed on the second substrate 102.

For example, a plurality of light emitting chips 130 may be provided, as exemplarily shown in FIG. 1, and the light emitting chips 130 may be disposed on the second substrate 102 so as to be spaced apart from each other.

A plurality of second conductive layers 124 may be provided and the second conductive layers 124 may be disposed so as to be spaced apart from each other. However, the disclosure is not limited thereto and a single second conductive layer may be formed.

Although FIG. 1 illustrates one first conductive layer 122, the disclosure is not limited thereto. A plurality of first conductive layers may be provided, the first conductive layers may be disposed so as to be spaced apart from each other, and the wire 166 may be bonded to each of the first conductive layers.

Figure 9:
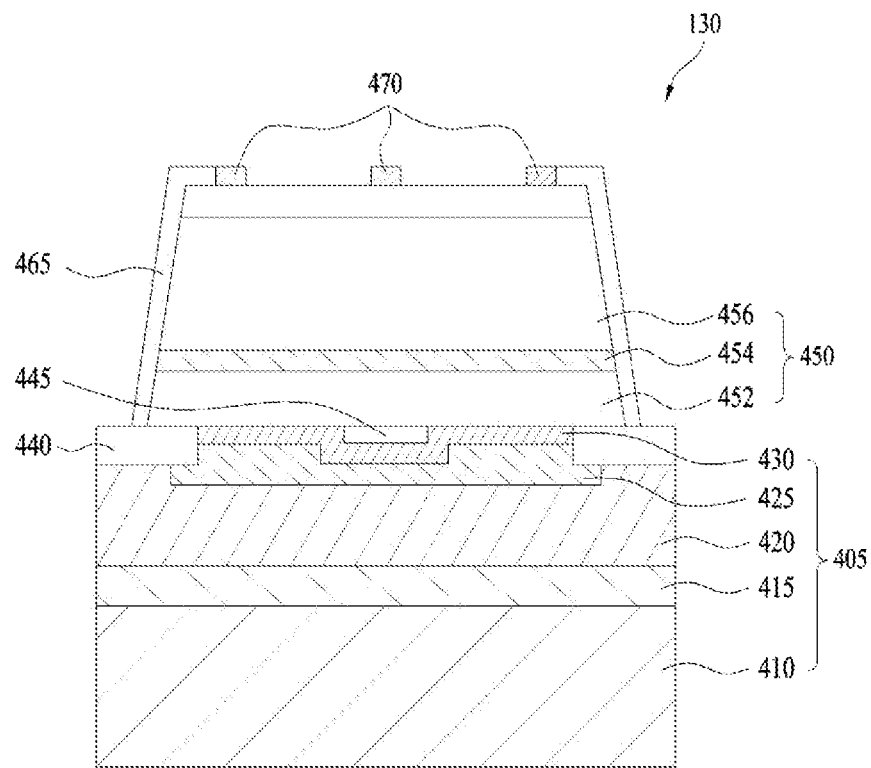
FIG. 9 is a cross-sectional view of a light emitting chip in accordance with one embodiment, shown in FIG. 1.

FIG. 9 is a cross-sectional view of the light emitting chip 130 in accordance with one embodiment, shown in FIG. 1.

With reference to FIG. 9, the light emitting chip 130 includes a second electrode 405, a protective layer 440, a current blocking layer 445, a light emitting structure 450, a passivation layer 465 and a first electrode 470. For example, the light emitting chip 130 may be a light emitting diode chip.

The second electrode 405 together with the first electrode 470 supplies power to the light emitting structure 450. The second electrode 405 may include a support layer 410, a bonding layer 415, a barrier layer 420, a reflective layer 425 and an ohmic layer 430.

The support layer 410 supports the light emitting structure 450. The support layer 410 may be formed of a metal or a semiconductor material. Further, the support layer 410 may be formed of a material having high electrical conductivity and thermal conductivity. For example, the support layer 410 may be formed of a metal including at least one of copper (Cu), a copper alloy, gold (Au), nickel (Ni), molybdenum (Mo) and copper-tungsten (Cu—W), or formed of a semiconductor including at least one of Si, Ge, GaAs, ZnO and SiC.

The bonding layer 415 may be disposed between the support layer 410 and the barrier layer 420 and serve to bond the support layer 410 and the barrier layer 420. The bonding layer 415 may include a metal, for example, at least one of In, Sn, Ag, Nb, Pd, Ni, Au and Cu. The bonding layer 415 is formed so as to bond the support layer 410 to the barrier layer 420 and, thus, if the support layer 410 is formed by plating or deposition, the bonding layer 415 may be omitted.

The barrier layer 420 may be disposed under the reflective layer 425, the ohmic layer 430 and the protective layer 440 and prevent metal ions of the bonding layer 415 and the support layer 410 from being diffused to the light emitting structure 450 via the reflective layer 425 and the ohmic layer 430. For example, the barrier layer 420 may include at least one of Ni, Pt, Ti, W, V, Fe and Mo and be formed to have a single layer structure or a multilayer structure.

The reflective layer 425 may be disposed on the barrier layer 420 and reflect light incident from the light emitting structure 450 so as to improve light extraction efficiency. The reflective layer 425 may be formed of a reflective material, for example, a metal including at least one of Ag, Ni, Al, Rh, Pd, Ir, Ru, Mg, Zn, Pt, Au and Hf, or an alloy thereof.

The reflective layer 425 may be formed to have a multilayer structure using a metal or an alloy and a light-transmitting conductive material, such as IZO, IZTO, IAZO, IGZO, IGTO, AZO and ATO, for example, formed as IZO/Ni, AZO/Ag, IZO/Ag/Ni or AZO/Ag/Ni.

The ohmic layer 430 may be disposed between the reflective layer 425 and a second conductivity-type semiconductor layer 452 and be in ohmic contact with the second conductivity-type semiconductor layer 452 so that power may be effectively supplied to the light emitting structure 450.

The ohmic layer 430 may be formed selectively using a light-transmitting conductive layer and a metal. For example, the ohmic layer 430 may include a metal being in ohmic contact with the second conductivity-type semiconductor layer 452, for example, at least one of Ag, Ni, Cr, Ti, Pd, Ir, Sn, Ru, Pt, Au and Hf.

The protective layer 440 may be disposed at the edge of the second electrode layer 405. For example, the protective layer 440 may be disposed at the edge of the ohmic layer 430, the edge of the reflective layer 425, the edge of the barrier layer 420 or the edge of the support layer 410.

The protective layer 440 may prevent deterioration in reliability of the light emitting chip 130 due to interfacial debonding between the light emitting structure 450 and the second electrode layer 405. The protective layer 440 may be formed of an electrically insulating material, for example, ZnO, $SiO_2$, $Si_3N_4$, $TiO_x$ (x being a positive real number) or $Al_2O_3$.

The current blocking layer 445 may be disposed between the ohmic layer 430 and the light emitting structure 450, prevent current channeling and thus disperse current. The upper surface of the current blocking layer 445 may contact the second conductivity-type semiconductor layer 452 and the lower surface or the lower and side surfaces of the current blocking layer 445 may contact the ohmic layer 430. The current blocking layer 445 may be disposed such that at least a part thereof overlaps the first electrode 470 in the vertical direction.

The current blocking layer 445 may be formed between the ohmic layer 430 and the second conductivity-type semiconductor layer 452 or formed between the reflective layer 425 and the ohmic layer 430, but the disclosure is not limited thereto.

The light emitting structure 450 may be disposed on the ohmic layer 430 and the protective layer 440. The side surface of the light emitting structure 450 may be inclined during an isolation etching process for division into unit chips. The light emitting structure 450 may include the second conductivity-type semiconductor layer 452, an active layer 454 and a first conductivity-type semiconductor layer 456, and emit light.

The second conductivity-type semiconductor layer 452 may be formed of a compound semiconductor, i.e., a group III-V or group II-VI compound semiconductor, and be doped with a second conductivity-type dopant. For example, the second conductivity-type semiconductor layer 452 may be formed of a semiconductor having a composition of $In_xAl_yGa_{1-x-y}N$ ($0 \leq x \leq 1$, $0 \leq y \leq 1$, $0 \leq x+y \leq 1$). The second conductivity-type semiconductor layer 452 may be formed of any one selected from the group consisting of GaN, AlN, AlGaN, InGaN, InN, InAlGaN, AlInN, AlGaAs, GaP, GaAs, GaAsP and AlGaInP, and be doped with a p-type dopant (for example, Mg, Zn, Ca, Sr or Ba).

The active layer 454 may generate light by energy generated through recombination of electrons and holes supplied from the first conductivity-type semiconductor layer 456 and the second conductivity-type semiconductor layer 452.

The active layer 454 may be formed of a compound semiconductor, for example, a group III-V or group II-VI compound semiconductor, and have a single well structure, a multi-well structure, a quantum wire structure or a quantum dot structure. If the active layer 454 has a quantum well structure, the active layer 454 may have a single or quantum well structure including a well layer having a composition of $In_xAl_yGa_{1-x-y}N$ ($0 \leq x \leq 1$, $0 \leq y \leq 1$, $0 \leq x+y \leq 1$) and a barrier layer having a composition of $In_aAl_bGa_{1-a-b}N$ ($0 \leq a \leq 1$, $0 \leq b \leq 1$, $0 \leq a+b \leq 1$). The well layer may be formed of a material having a lower energy bandgap than the energy bandgap of the barrier layer.

The first conductivity-type semiconductor layer 456 may be formed of a compound semiconductor, i.e., a group III-V or group II-VI compound semiconductor, and be doped with a first conductivity-type dopant. For example, the first conductivity-type semiconductor layer 456 may be formed of a semiconductor having a composition of $In_xAl_yGa_{1-x-y}N$ ($0 \leq x \leq 1$, $0 \leq y \leq 1$, $0 \leq x+y \leq 1$). The first conductivity-type semiconductor layer 456 may be formed of any one selected from the group consisting of GaN, AlN, AlGaN, InGaN, InN, InAlGaN, AlInN, AlGaAs, GaP, GaAs, GaAsP and AlGaInP, and be doped with an n-type dopant (for example, Si, Ge or Sn).

The light emitting chip 130 may emit any one of blue light, red light, green light and yellow light according to compositions of the first conductivity-type semiconductor layer 456, the active layer 454 and the second conductivity-type semiconductor layer 452.

The passivation layer 465 may be disposed on the side surface of the light emitting structure 450 so as to electrically protect the light emitting structure 450. The passivation layer 465 may be disposed on a part of the upper surface of the first conductivity-type semiconductor layer 456 or the upper surface of the protective layer 440. The passivation layer 465 may be formed of an insulating material, for example, $SiO_2$, $SiO_x$, $SiO_xN_y$, $Si_3N_4$ or $Al_2O_3$.

The first electrode 470 may be disposed on the first conductivity-type semiconductor layer 456. The first electrode 470 may be formed in a designated pattern. The first electrode 470 may include a pad part for wire-bonding and branched finger electrodes (not shown) extending from the pad part.

In order to increase light extraction efficiency, a roughness pattern (not shown) may be formed on the upper surface of the first conductivity-type semiconductor layer 456. Further, in order to increase light extraction efficiency, a roughness pattern (not shown) may be formed on the upper surface of the first electrode 470.

Although FIG. 9 exemplarily illustrates a vertical light emitting diode as the light emitting chip 130, the disclosure is not limited thereto and, in accordance with another embodiment, the light emitting chip 130 may be a horizontal light emitting diode or a flip-chip type light emitting diode.

The light emitting chip 130 may be conductively connected to the first conductive layer 122 and the second conductive layer 124.

The second electrode 405 of the light emitting chip 130 may be disposed on the second conductive layer 124 disposed on the second substrate 102 using eutectic bonding or die bonding, thus being conductively connected to the second conductive layer 144.

The wire 166 may conductively connect the first electrode 470 of the light emitting chip 130 and the first conductive layer 122 disposed on the second substrate 102.

The wire 162 may conductively connect the first conductive layer 122 disposed on the second substrate 102 and the third conductive layer 112 disposed on the first substrate 101. One or more wires 162 may be provided.

The wire 164 may conductively connect the second conductive layer 124 disposed on the second substrate 102 and the fourth conductive layer 114 provided on the first substrate 101. One or more wires 164 may be provided.

The wavelength conversion unit 150 may be located on the light emitting chip 130 and change the wavelength of light emitted from the light emitting chip 130. For example, the wavelength conversion unit 150 may be disposed on the upper surface of the light emitting chip 130, and the lower surface of the wavelength conversion unit 150 may contact the upper surface of the light emitting chip 130.

The wavelength conversion unit 150 may include a colorless transparent polymer resin, such as epoxy or silicone, and phosphors.

The wavelength conversion unit 150 may include at least one of a red phosphor, a green phosphor and a yellow phosphor.

The wavelength conversion unit 150 may enclose a part of the wire 166. For example, the wavelength conversion unit 150 may enclose one end of the wire 166 connected to the first electrode 270 of the light emitting chip 130.

The molding part 140 may be disposed on the substrate 103 so as to enclose the light emitting chip 130 and the wires 162 to 166. For example, the molding part 140 may fill the cavity 105 of the first substrate 101. Further, for example, the molding part 140 may contact the side surface of the light emitting chip 130 and the side surface of the wavelength conversion unit 150.

The molding part 140 may expose an upper surface 154 of the wavelength conversion unit 150.

The upper surface of the molding part 140 may be located at a higher position than a highest point T1 of the wire 166. Thereby, the molding part 140 may enclose the wires 162 to 166 and prevent the wires 162 to 166 from being exposed to the outside or protruding to the outside of the molding part 140.

The highest point T1 of the wire 166 may be located so as to be aligned with the boundary between the side surface of the wavelength conversion unit 150 and the molding part 140, but the disclosure is not limited thereto. For example, one side of the wire 166 based on the highest point T1 may be enclosed by the wavelength conversion unit 150 and the other side of the wire 166 based on the highest point T1 may be enclosed by the molding part 140.

In this embodiment, the molding part 140 may prevent the wire (for example, the wire 166) from being damaged or deformed due to impact or pressure or corroding due to air and, thus, reliability of the light emitting element package 100 may be secured.

The molding part 140 may be formed of a non-conductive molding member which may reflect light, for example, white silicone, but the disclosure is not limited thereto.

Since the molding part 40 contacts the light emitting chips 130 and directly reflects light emitted from the light emitting chips 130, in accordance with this embodiment, light loss due to absorption or transmission by air or the first substrate 101 and the second substrate 102 may be reduced and luminous efficacy may be improved.

In accordance with another embodiment, the molding part 140 may be formed of a non-conductive molding member which may transmit light. For example, the molding part 140 may be formed of silicone resin, epoxy resin, glass, glass ceramic, polyester resin, acrylic resin, urethane resin, nylon resin, polyamide resin, polyimide resin, vinyl chloride resin, polycarbonate resin, polyethylene resin, Teflon resin, polystyrene resin, polypropylene resin or polyolefin resin.

In accordance with yet another embodiment, the molding part 140 may be formed of a molding member which may absorb light, for example, a black resin, Polyphthalamide (PPA) resin, with which carbon black is mixed, black Epoxy Molding compound (EMC) resin or black silicone.

Figure 3A:
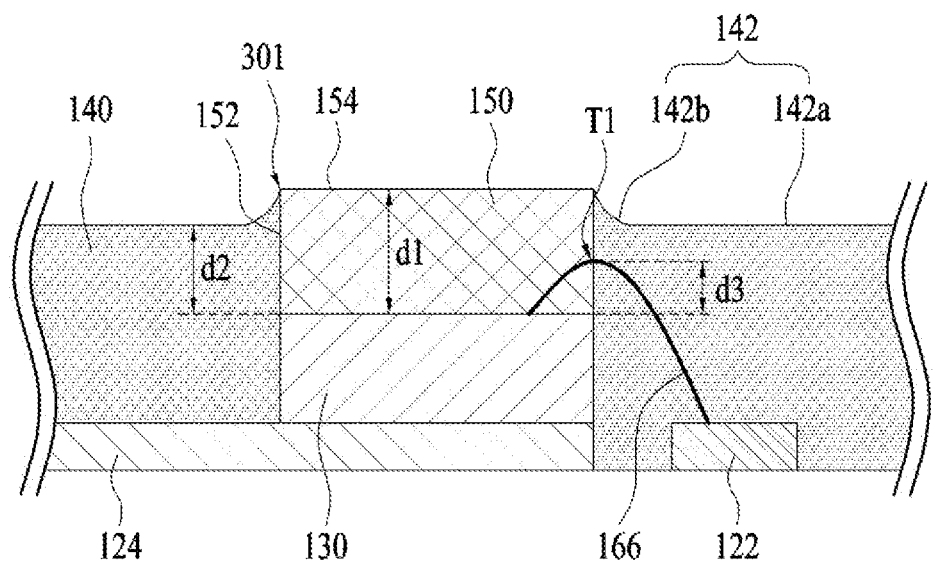
FIG. 3A is an enlarged view of a wavelength conversion unit and a wire in accordance with one embodiment, shown in FIG. 2.

FIG. 3A is an enlarged view of the wavelength conversion unit 150 and the wire 166 in accordance with one embodiment, shown in FIG. 2.

With reference to FIG. 3A, the upper surface 154 of the wavelength conversion unit 150 may be located at a higher position than an upper surface 142 of the molding part 140. The upper surface 154 of the wavelength conversion unit 150 may be exposed from the upper surface 142 of the molding part 140, and the wavelength conversion unit 150 may protrude from the upper surface 142 of the molding part 140.

A distance d1 from the upper surface of the light emitting chip 130 to the upper surface 154 of the wavelength conversion unit 150 may be greater than a distance d2 from the upper surface of the light emitting chip 130 to the upper surface 143 of the molding part 140 (d1>d2). However, on the boundary where the molding part 140 and a corner 301 of the upper surface 142 of the wavelength conversion unit 150 meet, the distance d1 may be equal to the distance d2 (d1=d2).

A distance d3 from the upper surface of the light emitting chip 130 to the highest point T1 of the wire 166 may be less than the distance d2 from the upper surface of the light emitting chip 130 to the upper surface 142 of the molding part 140 (d2>d3). The reason for this is to prevent the wire 166 from being exposed to the outside of the molding part 140. Here, the highest point T1 of the wire 166 may be a part of the wire 166 which may be located at the highest position above the upper surface of the light emitting chip 130.

As exemplarily shown in FIG. 3A, the wavelength conversion unit 150 may enclose or seal one end of the wire 166 bonded to the light emitting chip 130. For example, the wavelength conversion unit 150 may enclose or seal the first electrode 470 of the light emitting chip 130 bonded to the wire 166 and one end of the wire 166 bonded to the first electrode 470.

The molding part 140 may contact the edge of the upper surface of the wavelength conversion unit 150. For example, the molding part 140 may contact a corner part 301, at which the upper surface and the side surface of the wavelength conversion unit 150 meet.

For example, the upper surface 142 of the molding part 140 may include a first upper surface 142a being parallel with the upper surface 154 of the wavelength conversion unit 150 and a second upper surface 142b located between the first upper surface 142a and the corner part 301 of the upper surface 154 of the wavelength conversion unit 150.

The second upper surface 142b of the molding part 140 may contact the corner part 301 of the upper surface 154 of the wavelength conversion unit 150 and the first upper surface 142a, and may be a concave surface. The reason why the second upper surface 142b is concave is that the molding member has fluidity during a molding process and the molding member contracts after hardening.

In consideration of ease in the molding process and a refractive index, a coefficient of viscosity of the molding member used to form the molding part 140 may be 1500 mPas-2000 mPas. If the coefficient of viscosity of the molding member is less than 1500 mPas or exceeds 2000 mPas, the molding member may not completely enclose the wire 166 and thus the wire 166 may be exposed to the outside, and a desired refractive index may not be achieved.

The distance d2 from the upper surface of the light emitting chip 130 to the upper surface 142 of the molding part 140, for example, the first upper surface 142a, may be greater than a value acquired by adding 37 μm to the distance d3 from the upper surface of the light emitting chip 130 to the highest point T1 of the wire 166.

The reason for this is that, when a dispensing process of the molding member having a coefficient of viscosity of 1500 mPas-2000 mPas is carried out according to the height of a dispensing target, the height of the molding member is lower than the set height of the target by about 30 μm and, then when the molding member is hardened, the height of the molding member is lowered by about 7 μm due to contraction of the molding member.

Here, the height of the dispensing target may be located at a point lowered from the upper surface 154 of the wavelength conversion unit 150 by 30 μm, and the reason why the height of the dispensing target is set to the point lowered from the upper surface 154 by 30 μm is that a process margin based on the dispensing and hardening processes is provided to secure reliability.

Therefore, in consideration of the process margin (about 30 μm), lowering of the height of the target due to the dispensing process (about 30 μm) and contraction of the molding member during hardening (about 7 μm), in order to prevent the wire 166 from being exposed to the outside of the molding part 140, a distance from the upper surface 154 of the wavelength conversion unit 150 to the highest point T1 of the wire 166 may be 67 μm or more.

Further, the distance d1 from the upper surface of the light emitting chip 130 to the upper surface 154 of the wavelength conversion unit 150 may be greater than a value acquired by adding 37 μm to the distance d3 from the upper surface of the light emitting chip 130 to the highest point T1 of the wire 166.

Since the distance d1 and the distance d2 are greater than the value acquired by adding 37 μm to the distance d3, in this embodiment, exposure of the wire 166 to the outside of the molding part 140 and the wavelength conversion unit 150 may be prevented, damage to the wire due to external impact and oxidation of the wire may be prevented thereby, and reliability of wire bonding may be improved.

Figure 3B:
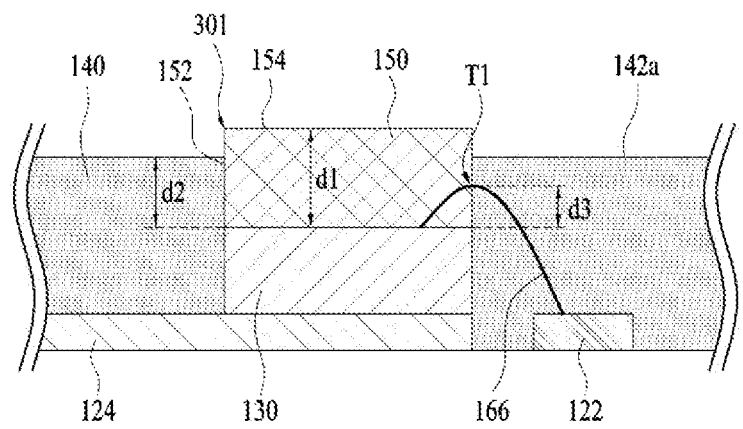
FIG. 3B is an enlarged view of a wavelength conversion unit and a wire in accordance with another embodiment, shown in FIG. 2.

FIG. 3B is an enlarged view of the wavelength conversion unit 150 and the wire 166 in accordance with another embodiment, shown in FIG. 2.

With reference to FIG. 3B, the molding part 140 may not contact the edge of the upper surface 154 of the wavelength conversion unit 150, for example, the corner 301, the molding part 140 may be spaced apart from the corner part 301 of the upper surface 154 of the wavelength conversion unit 150 and contact the side surface of the wavelength conversion unit 150, and the wavelength conversion unit 150 may have a structure of protruding from the upper surface 154 of the molding part 140. The embodiment of FIG. 3B is the same as the embodiment of FIG. 3A except for the above description, i.e., relations among the distances d1, d2 and d3 in the embodiment of FIG. 3B are the same as those in the embodiment of FIG. 3A. However, in FIG. 3B, the distance d1 may be greater than the distance d2 (d1>d2) even on the boundary where the molding part 140 and the corner 301 of the upper surface 142 of the wavelength conversion unit 150 meet.

Figure 4:
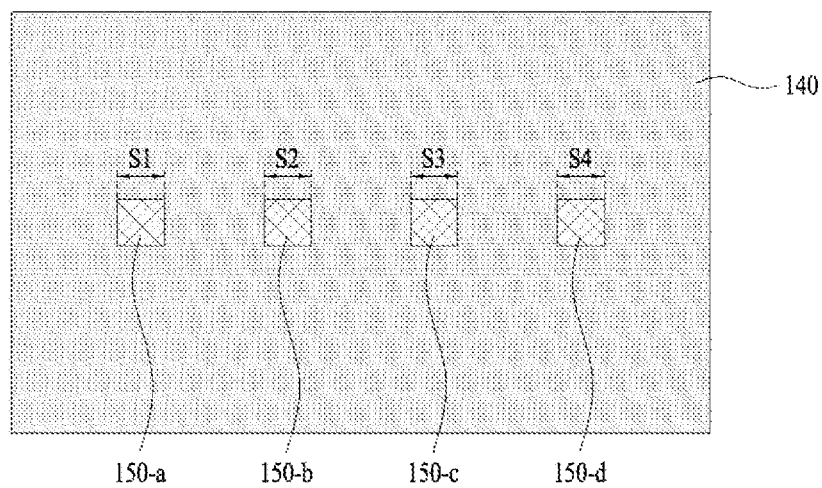
FIG. 4 is a view illustrating a wavelength conversion unit shown in FIG. 1.

FIG. 4 is a view illustrating the wavelength conversion unit 150 shown in FIG. 1.

With reference to FIG. 4, the wavelength conversion unit 150 may include a plurality of sub-wavelength conversion units 150-a to 150d.

Each of the sub-wavelength conversion units 150-a to 150d may be located or arranged so as to correspond to any one of the light emitting elements 130.

Figure 5:
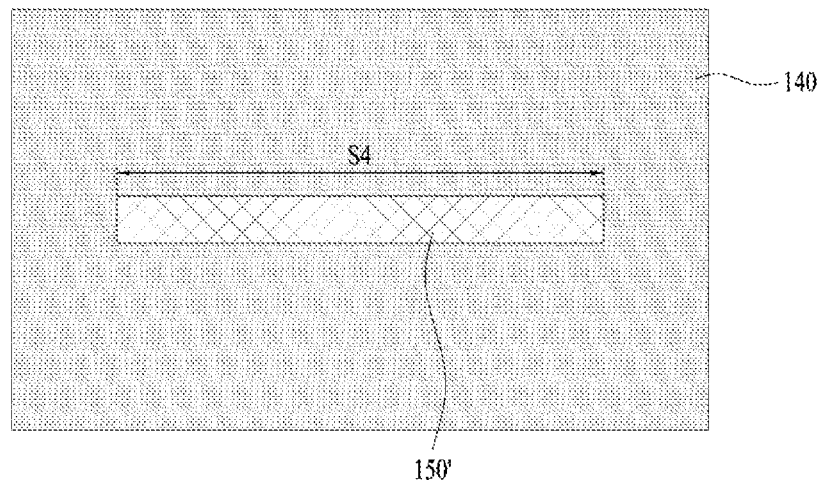
FIG. 5 is a view illustrating a wavelength conversion unit in accordance with another embodiment.

FIG. 5 is a view illustrating a wavelength conversion unit 150' in accordance with another embodiment.

With reference to FIG. 5, the wavelength conversion unit 150' may be located so as to correspond to an area S4 covering individual areas of the light emitting chips and areas located between two adjacent light emitting elements, and be formed in an integrated linear shape.

Figure 6:
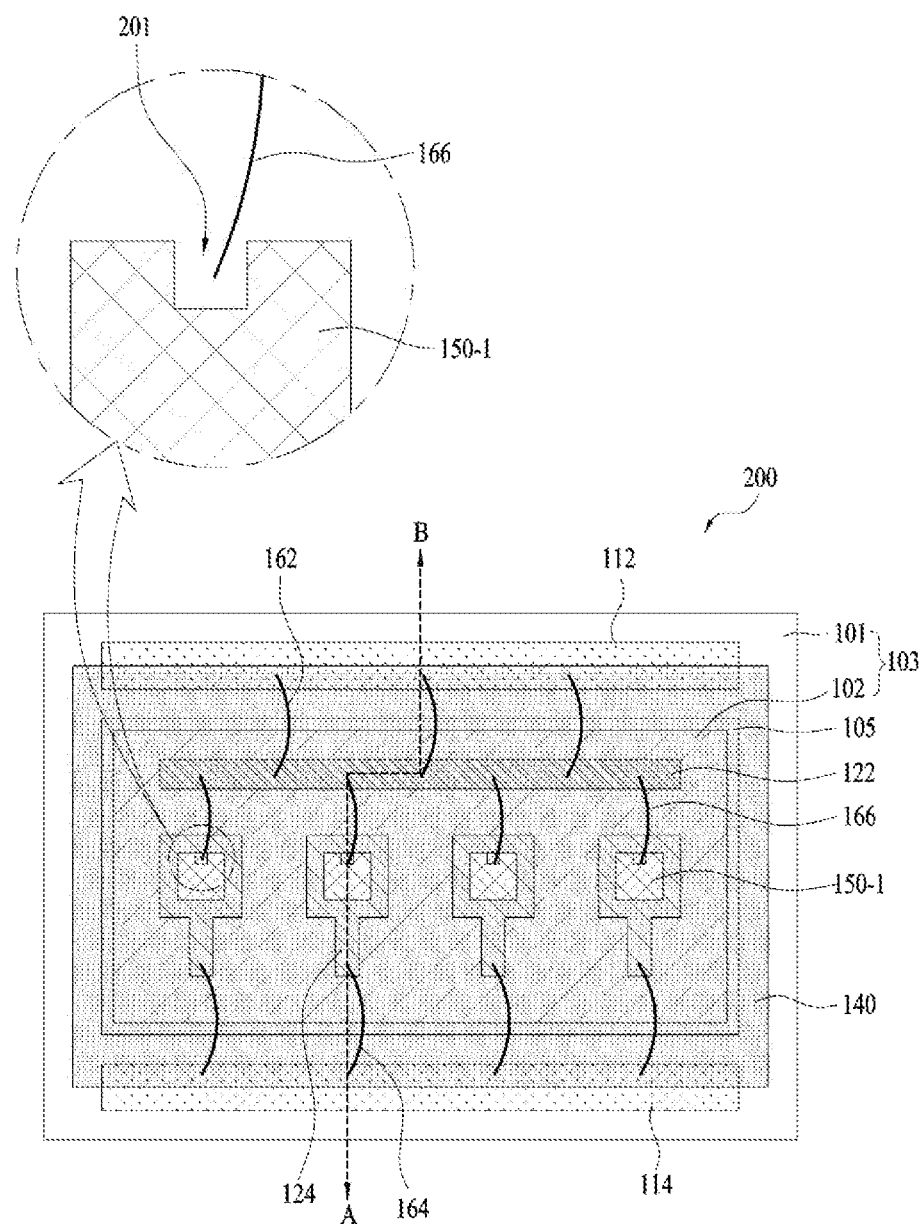
FIG. 6 is a plan view of a light emitting element package in accordance with another embodiment.
Figure 7:
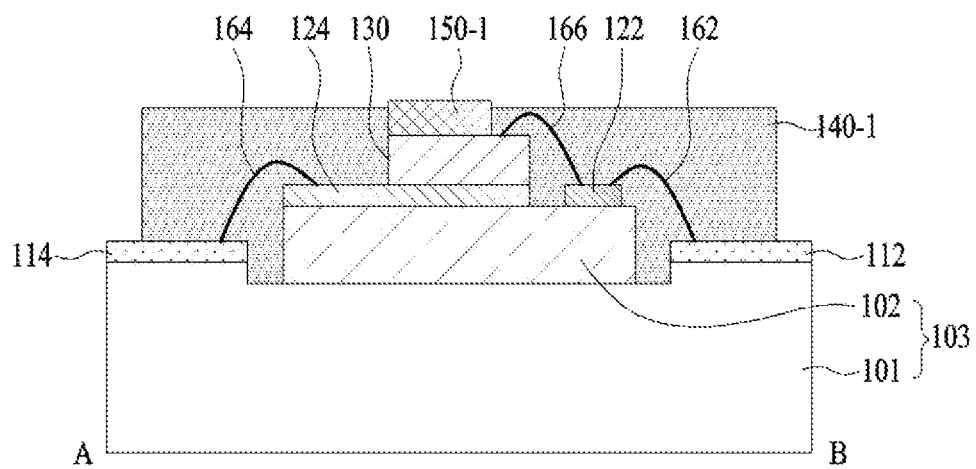
FIG. 7 is a cross-sectional view taken along line A-B of the light emitting element package shown in FIG. 6.

FIG. 6 is a plan view of a light emitting element package 200 in accordance with another embodiment, and FIG. 7 is a cross-sectional view taken along line A-B of the light emitting element package 200 shown in FIG. 6. Some parts in this embodiment, which are substantially the same as those in the embodiment shown in FIGS. 1 and 2, are denoted by the same reference numerals even though they are depicted in different drawings and a detailed description thereof will thus be simplified or omitted because it is considered to be unnecessary.

With reference to FIGS. 6 and 7, the light emitting element package 200 includes a substrate 103, a plurality of conductive layers 112, 114, 122 and 124, at least one light emitting chip 130, a molding part 140, a wavelength conversion unit 150-1 and wires 162, 164 and 166.

With reference to FIGS. 6 and 7, the wavelength conversion unit 150-1 may not contact the wire 166 bonded to the at least one light emitting chip 130 and may be spaced apart from the wire 166.

For example, the wavelength conversion unit 150-1 may be spaced apart from one end of the wire 166 bonded to a first electrode 470 of the light emitting chip 130. For example, the wavelength conversion unit 150-1 may be provided with a through hole 201 through which the wire 166 passes through, and the wire 166 may be bonded to the first electrode 470 via the through hole 201. For example, one end of the wire 166 may pass through the through hole 201 and be connected to a pad part of the first electrode 470 of the light emitting chip 130, and the other end of the wire 166 may be connected to a first conductive layer 122.

The through hole 201 may be a hole passing through the upper and lower surfaces of the wavelength conversion unit 150-1. The wire 166 may be disposed so as to be spaced apart from the through hole 201. Although FIG. 6 illustrates the through hole 201 as having a structure, a part of the side surface of which is opened to the outside of the wavelength conversion unit 150-1, the disclosure is not limited thereto and, in accordance with another embodiment, the through hole may be a hole having a structure which is enclosed by the wavelength conversion unit 150-1 and passes through the upper and lower surfaces of the wavelength conversion unit 150-1.

Further, in accordance with yet another embodiment, the wavelength conversion unit 150-1 may be spaced apart from the pad part of the first electrode 470 of the light emitting chip 130, to which the wire 166 is bonded.

The molding part 140-1 may seal the first electrode 470 of the light emitting chip 130 and/or one end of the wire 166 bonded to the first electrode 470.

The molding part 140-1 may fill the through hole 201 of the wavelength conversion unit 150-1. For example, the molding part 140-1 may contact one end of the wire 166 bonded to the first electrode 470 of the light emitting chip 130 located within the through hole 201.

Although FIG. 2 illustrates one end of the wire 166 bonded to the first electrode 470 of the light emitting chip 130 as being enclosed by the wavelength conversion unit 150, FIG. 7 illustrates one end of the wire 166 bonded to the first electrode 470 of the light emitting chip 130 as being enclosed by the molding part 140-1.

Figure 8A:
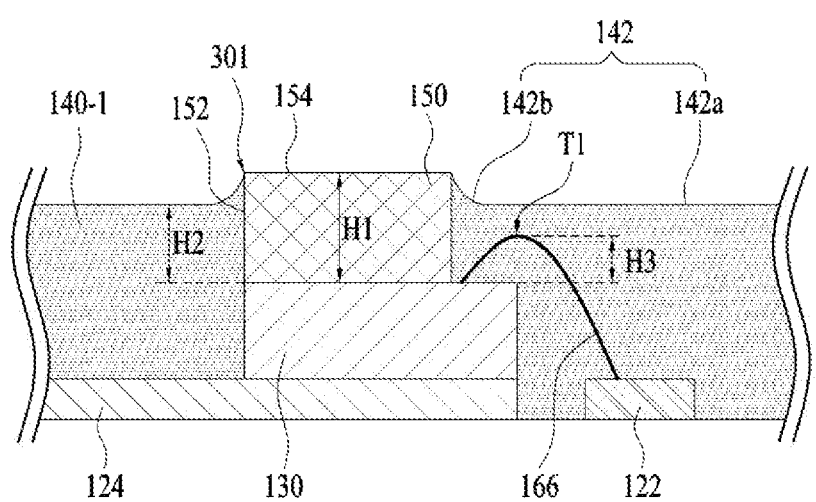
FIG. 8A is an enlarged view of a wavelength conversion unit and a wire in accordance with one embodiment, shown in FIG. 7.

FIG. 8A is an enlarged view of the wavelength conversion unit 150-1 and the wire 166 in accordance with one embodiment, shown in FIG. 7.

With reference to FIG. 8A, the molding part 140-1 may contact the edge of the upper surface of the wavelength conversion unit 150-1. For example, the molding part 140-1 may contact a corner part 301, at which the upper surface and the side surface of the wavelength conversion unit 150-1 meet.

For example, an upper surface 142 of the molding part 140-1 may include a first upper surface 142*a* being parallel with an upper surface 154-1 of the wavelength conversion unit 150-1 and a second upper surface 142*b* located between the first upper surface 142*a* and the corner part 301 of the upper surface 154-1 of the wavelength conversion unit 150-1.

A distance H1 from the upper surface of the light emitting chip 130 to the upper surface 154-1 of the wavelength conversion unit 150-1 may be the same as the above-described distance d1 in FIG. 3A. Further, a distance H2 from the upper surface of the light emitting chip 130 to the upper surface 142 of the molding part 140-1 may be the same as the above-described distance d2 in FIG. 3A. Further, a distance H3 from the upper surface of the light emitting chip 130 to a highest point T1 of the wire 166 may be the same as the above-described distance d3 in FIG. 3A.

Further, size relations among the distances H1, H2 and H3 may be the same as the size relations among the distances d1, d2 and d3 described above in FIG. 3A.

Figure 8B:
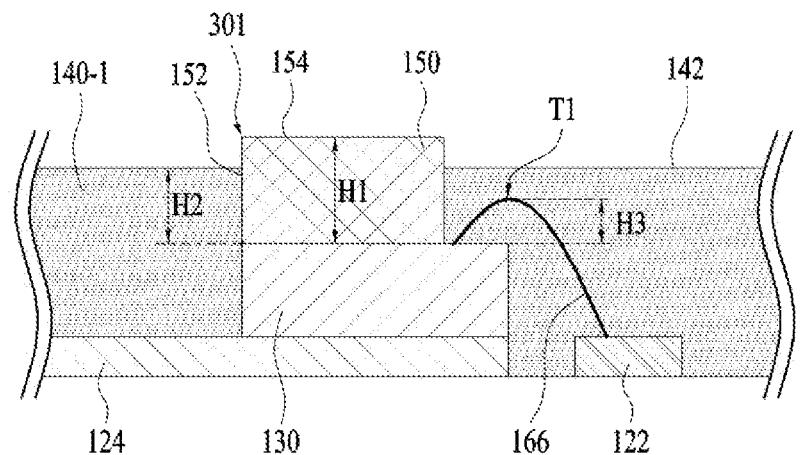
FIG. 8B is an enlarged view of a wavelength conversion unit and a wire in accordance with another embodiment, shown in FIG. 7.

FIG. 8B is an enlarged view of the wavelength conversion unit 150-1 and the wire 166 in accordance with another embodiment, shown in FIG. 7.

With reference to FIG. 8B, the molding part 140-1 may not contact the edge of the upper surface 154-1 of the wavelength conversion unit 150-1, and the molding part 140-1 may be spaced apart from the corner part 301 of the upper surface 154-1 of the wavelength conversion unit 150-1 and contact the side surface of the wavelength conversion unit 150-1.

Figure 10:
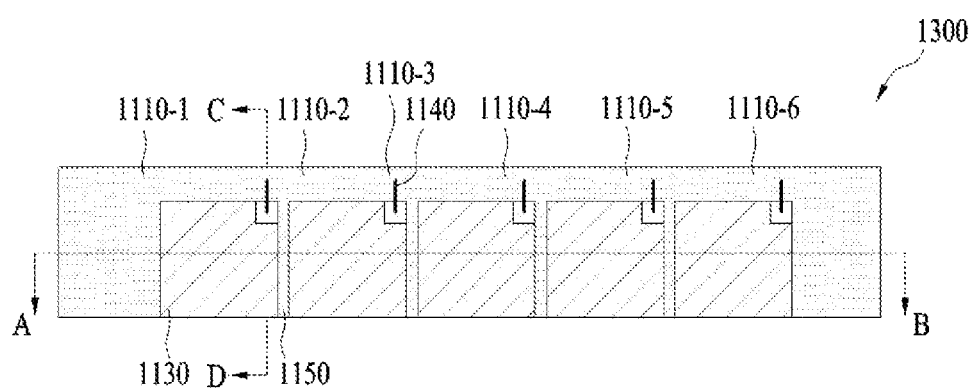
FIG. 10 is a plan view of a light emitting element package in accordance with another embodiment.
Figure 11:
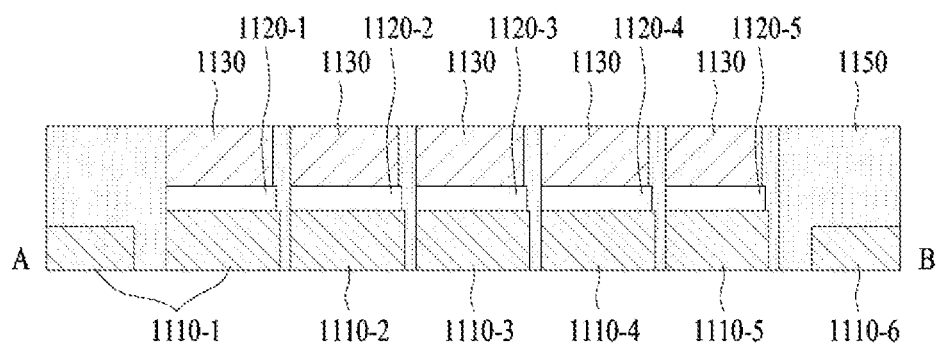
FIG. 11 is a cross-sectional view taken along line A-B of the light emitting element package shown in FIG. 10.
Figure 12:
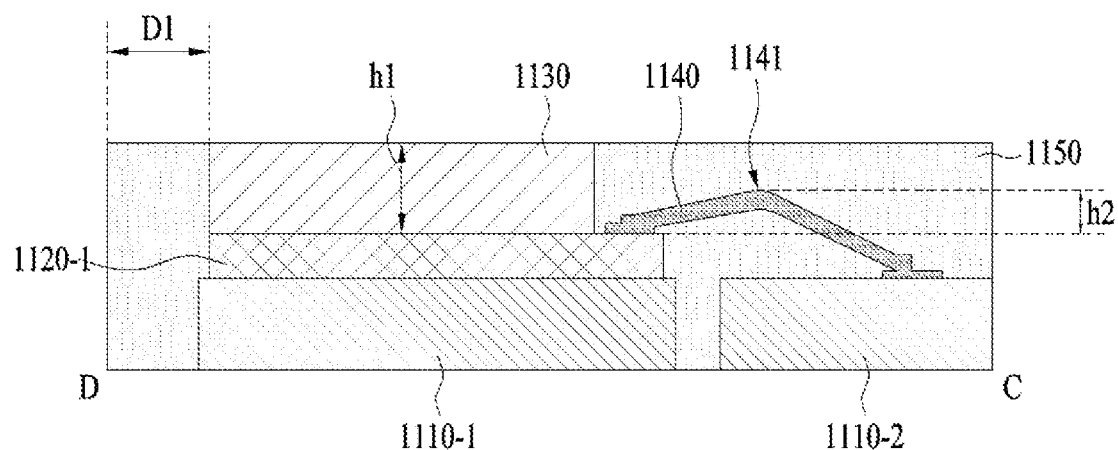
FIG. 12 is a cross-sectional view taken along line C-D of the light emitting element package shown in FIG. 10.

FIG. 10 is a plan view of a light emitting element package 300 in accordance with another embodiment, FIG. 11 is a cross-sectional view taken along line A-B of the light emitting element package 300 shown in FIG. 10, and FIG. 12 is a cross-sectional view taken along line C-D of the light emitting element package 300 shown in FIG. 10.

With reference to FIGS. 10 to 12, the light emitting element package 300 includes a plurality of lead frames 1110-1 to 1110-6, a plurality of light emitting elements 1120-1 to 1120-5, phosphor plates 1130, wires 1140 and a resin layer 1150.

The lead frames 1110-1 to 1110-6 are spaced apart from each other so as to be conductively isolated from each other.

The resin layer 1150, which will be described later, may be disposed between the lead frames 1110-1 to 1110-6. For example, parts of the resin layer 1150 may be disposed between opposite side surfaces of the adjacent lead frames 1110-1 and 1110-2, 1110-2 and 1110-3, 1110-3 and 1110-4, 1110-4 and 1110-5, and 1110-5 and 1110-6.

The lead frames 1110-1 to 1110-6 may be formed of a conductive material, such as a metal, for example, formed of at least one of titanium (Ti), copper (Cu), nickel (Ni), gold (Au), chrome (Cr), tantalum (Ta), platinum (Pt), tin (Sn), silver (Ag) and phosphorous (P), or an alloy thereof, and have a single layer structure or a multilayer structure.

A separate reflective member (not shown) may be additionally disposed on the lead frames 1110-1 to 1110-6 and thus reflect light emitted from the light emitting elements 1120-1 to 1120-5 so as to improve luminous efficacy, but the disclosure is not limited thereto.

The lead frames 1110-1 to 1110-6 may respectively have various shapes according to the shapes of the light emitting elements 1120-1 to 1120-5 and electrical connections thereof.

For example, each of the first to fifth lead frames 1110-1 to 1110-6 may include a first part P1 (with reference to FIG. 13A) on which each of the light emitting elements 1120-1 to 1120-5 is disposed, and a second part P2 (with reference to FIG. 13I) extending from the first part P1.

The part P1 may have the same shape as a corresponding one of the light emitting elements 1120-1 to 1120-5, but the disclosure is not limited thereto. For example, the first part P1 may have a rectangular shape without being limited thereto, and have a circular shape or a polygonal shape.

Each of the light emitting elements 1120-1 to 1120-5 may be conductively connected to a corresponding one of the lead frames 1110-1 to 1110-6 and another one adjacent to the corresponding one.

Each of the light emitting elements 1120-1 to 1120-5 may be disposed on the upper surface of a corresponding one of the lead frames 1110-1 to 1110-6.

For example, each of the light emitting elements 1120-1 to 1120-5 may be a chip-type light emitting diode (LED) and be bonded to the upper surface of a corresponding one of the lead frames 1110-1 to 1110-5 by die bonding. For example, each of the light emitting elements 1120-1 to 1120-5 may be the light emitting element in accordance with the above-described embodiment shown in FIG. 9 and the description of FIG. 9 may be applied thereto.

Die bonding may include paste bonding in which a chip is bonded to a substrate using an adhesive (for example, an Ag paste/silicone), eutectic bonding in which a metal layer (for example, Au/Sn) is formed on a chip pad and then the metal layer (for example, Au/Sn) is bonded to a substrate at a high temperature, and flip chip bonding in which a chip pad and a substrate are directly bonded using a solder.

The light emitting elements 1120-1 to 1120-5 may be conductively connected to the lead frames 1110-1 to 1110-6 by the wires 1140.

The light emitting elements 1120-1 to 1120-5 shown in FIG. 10 may be connected in series through the lead frames 1110-1 to 1110-6.

For example, each of the light emitting elements 1120-1 to 1120-5 may be conductively connected to the upper surface of the corresponding lead frame, and be conductively connected to a lead frame adjacent to the corresponding lead frame by the wire 1140.

For example, a second electrode 405 (with reference to FIG. 9) of each of the light emitting elements 1120-1 to 1120-5 may be conductively connected to the first part P1 of the corresponding lead frame, and a first electrode 470 (with reference to FIG. 9) of each of the light emitting elements 1120-1 to 1120-5 may be conductively connected the second part P2 of the lead frame adjacent to the corresponding lead frame by the wire 1140.

Although FIG. 10 illustrates the light emitting elements connected in series and the shape and disposition of the lead frames therefor, in accordance with another embodiment, light emitting elements may be connected in parallel or in series-parallel and, for this purpose, the shape and disposition of lead frames may be variously modified.

The phosphor plates 1130 are disposed on the light emitting elements 1120-1 to 1120-5 and convert the wavelength of light emitted from the light emitting elements 1120-1 to 1120-5.

For example, the phosphor plate 1130 may be disposed on the upper surface of each of the light emitting elements 1120-1 to 1120-5.

The phosphor plates 1130 may be formed such that a colorless polymer resin, such as epoxy or silicone, and phosphors are mixed. The phosphor plates 1130 may be bonded to the light emitting elements 1120-1 to 1120-5 by an adhesive member, such as silicone, but the disclosure is not limited thereto.

Further, the phosphor plates 1130 may be coated on the upper surfaces of the light emitting elements 1120-1 to 1120-5 by conformal coating.

The phosphor plates 1130 may expose electrode pads of the light emitting elements 1120, which will be described later, for example, electrode pads of the first electrodes 470 of the light emitting elements shown in FIG. 9.

The wires 1140 may conductively connect the electrode pads of the light emitting elements 1120-1 to 1120-5 exposed by the phosphor plates 1130 and the upper surfaces of the lead frames. Although the wires 1140 may be spaced apart from the phosphor plates 1130, the disclosure is not limited thereto and, in accordance with another embodiment, the wires 1140 may contact the phosphor plates 1130.

A height h1 of the upper surfaces of the phosphor plates 1130 from the upper surfaces of the light emitting elements 1120-1 to 1120-5 may be greater than a height h2 of the highest points 141 of the wires 140 bonded to the electrode pads of the light emitting elements 1120-1 to 1120-5 (h1>h2).

This is to prevent the wires 1140 from protruding or being exposed to the outside of the resin layer 1150, as will be described later. Since the wires 1140 are not exposed to the outside of the resin layer 1150, in this embodiment, damage to or deformation of the wires due to impact or pressure or corrosion of the wires due to air may be prevented.

The height h1 of the phosphor plates 1130 may exceed at least 150 µm. The minimum height of the highest point 1141 of the wire 1140 which may execute a wire bonding process may be substantially 150 µm, and the height of the highest point 1141 of the wire 1140 may be 150 µm or more.

If the height h1 of the phosphor plates 1130 is 150 µm or less, the wires 1140 may be exposed to the outside of the resin layer 1150. On the other hand, if the thickness of the phosphor plates 1130 is excessively thick, light loss may occur. Therefore, in consideration of such an aspect, the height h1 of the phosphor plates 1130 may exceed 150 µm and be 200 µm or less. If the thickness of the phosphor plates 1130 exceeds 200 µm, light loss excessively increases and, thus, light efficiency may be reduced.

Although the upper surfaces of the phosphor plates 1130 may be flat, the disclosure is not limited thereto and, in accordance with another embodiment, the upper surfaces of the phosphor plates 110 may include a curved surface, such as a convex surface or a concave surface, and an orientation angle may be adjusted according to curvature of the curved surface.

The resin layer 1150 may surround the lead frames 1110-1 to 1110-6 except for the lower surfaces of the lead frames 1110-1 to 1110-6 and the upper surfaces of the phosphor plates 1130, the light emitting elements 1120-1 to 1120-5, the phosphor plates 1130 and the wires 1140, and expose the lower surfaces of the lead frames 1110-1 to 1110-6 and the upper surfaces of the phosphor plates 1130.

The resin layer 1150 may contact the side surfaces of the phosphor plates 130 and expose the upper surfaces of the phosphor plates 1130. The upper surfaces of the phosphor plates 1130 may be opposite the lower surfaces of the phosphor plates 1130 bonded to the upper surfaces of the light emitting elements 1120-1 to 1120-5.

The upper surface of the resin layer 1150 may be coplanar with the upper surfaces of the phosphor plates 1130 (hereinafter referred to as "case 1"). A distance to the upper surface of the resin layer 1150 from the upper surface of each of the light emitting elements 1120-1 to 1120-5 may be the same as a distance to the upper surface of the phosphor plate 1130 from the upper surface of each of the light emitting elements 1120-1 to 1120-5.

In accordance with another embodiment, the upper surface of the resin layer 1150 may be located at a position lower than the upper surfaces of the phosphor plates 1130 (hereinafter referred to as "case 2"). In case 2, the resin layer 1150 may expose not only the upper surfaces of the phosphor plates 1130 but also parts of the side surfaces of the phosphor plates 1130 adjacent to the upper surfaces of the phosphor plates 1130.

In accordance with yet another embodiment, the upper surface of the resin layer 1150 may be located at a position higher than the upper surfaces of the phosphor plates 1130 (hereinafter referred to as "case 3").

The orientation angle of the light emitting element package 300 may be changed according to a degree of exposure of the phosphor plates 1130. For example, the orientation angle of case 3 may be the smallest, the orientation angle of case 2 may be the greatest, and the orientation angle of case 1 may be between the orientation of case 3 and the orientation angle of case 2.

Since the minimum height of the highest point 1141 of the wire 1140 which may execute the wire bonding process is substantially 150 µm, if the height of the resin layer 1150 is less than 150 µm, the wires 1140 may be exposed to the outside of the resin layer 1150. Although the upper surface of the resin layer 1150 may be flat, the disclosure is not limited thereto and, in accordance with another embodiment, the upper surface of the resin layer 1150 may be curved.

Further, the resin layer 1150 may contact the side surfaces of the lead frames 1110-1 to 1110-6 and seal the side surfaces of the lead frames 1110-1 to 1110-6.

The resin layer 1150 may contact the electrode pads of the light emitting elements 1120-1 to 1120-5 exposed by the phosphor plates 1130 and the side surfaces of the light emitting elements 1120-1 to 1120-5, and enclose or seal the same. Further, the resin layer 1150 may enclose or seal the wires 1140.

Further, the resin layer 1150 may be disposed between the opposite side surfaces of the lead frames 1110-1 to 1110-6.

The resin layer 1150 shown in FIG. 11 may expose the lower surfaces of the first to fifth frames 1110-1 to 1110-5. Further, although the resin layer 1150 may expose a part of the side surface of at least one of the lead frames 1110-1 to 1110-6, the disclosure is not limited thereto and, in accordance with another embodiment, the resin layer 1150 may not expose the side surfaces of the lead frames.

Among the lead frames 1110-1 to 1110-6, the width D1 (with reference to FIG. 12) of the resin layer 1150 covering the side surfaces of the lead frames disposed at the outermost region (for example, the lead frames 1110-1 and 1110-6) may be 100 µm or more.

If the width D1 of the resin layer 1150 covering the side surfaces of the lead frames disposed at the outermost region (for example, the lead frames 1110-1 and 1110-6) is less than 100 µm, injection molding of the resin layer 1150 may not be easy and margin of a dicing process for separation into individual chips (with reference to FIG. 13D) may not be secured.

The resin layer 1150 may be formed of a non-conductive reflective member which reflects light, for example, a white resin, EMC, PCT, PPA, LCP or white silicone.

Further, the resin layer 1140 may be formed of a non-conductive member which absorbs light or has low light reflectivity, for example, a black resin, Polyphthalamide (PPA) resin, with which carbon black is mixed, black Epoxy Molding compound (EMC) resin or black silicone.

Since the resin layer 1150 may reflect or absorb light emitted from the light emitting elements 1120-1 to 1120-5 and prevent light from leaking to other regions than exposed regions of the phosphor plates 1130, this embodiment may achieve high contrast between turning-on and turning-off and thus be used in a lighting apparatus requiring high contrast, such as an electronic signboard or a vehicle lamp.

Further, although a general light emitting element package of a vehicle lamp uses a metal PCB and a ceramic substrate for the purpose of heat dissipation, in this embodiment, the metal PCB and the ceramic substrate are omitted and only the lead frames are provided in place thereof and, thus, a manufacturing process may be simplified and costs may be reduced.

FIGS. 13A to 13D are views illustrating a process of manufacturing the light emitting element package 300 shown in FIG. 10.

Figure 13A:
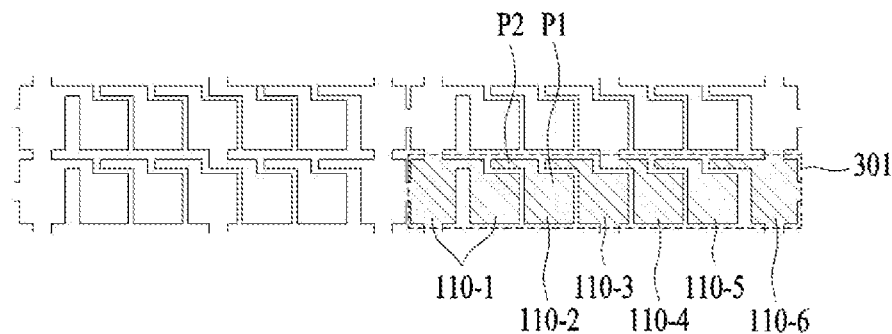
FIGS. 13A to 13D are views illustrating a process of manufacturing the light emitting element package shown in FIG. 10.

With reference to FIG. 13A, a lead frame pattern for formation of lead frames is prepared. The lead frame pattern may be prepared by forming a conductive material in a designated pattern.

A lead frame pattern shown in FIG. 13A is one exemplary pattern for series connection of the light emitting elements 1120-1 to 1120-5 shown in FIG. 10 in accordance with one embodiment and, in accordance with another embodiment, various lead frame patterns may be prepared according to series, parallel or series-parallel connection of light emitting elements.

For example, the lead frame pattern may be formed by plating copper (Cu) with Ag or Au.

In FIG. 13A, an oblique-lined region shown by a dotted line 1301 represents the lead frames 1110-1 to 1110-6 of the light emitting element package 300 shown in FIG. 10.

Figure 13B:
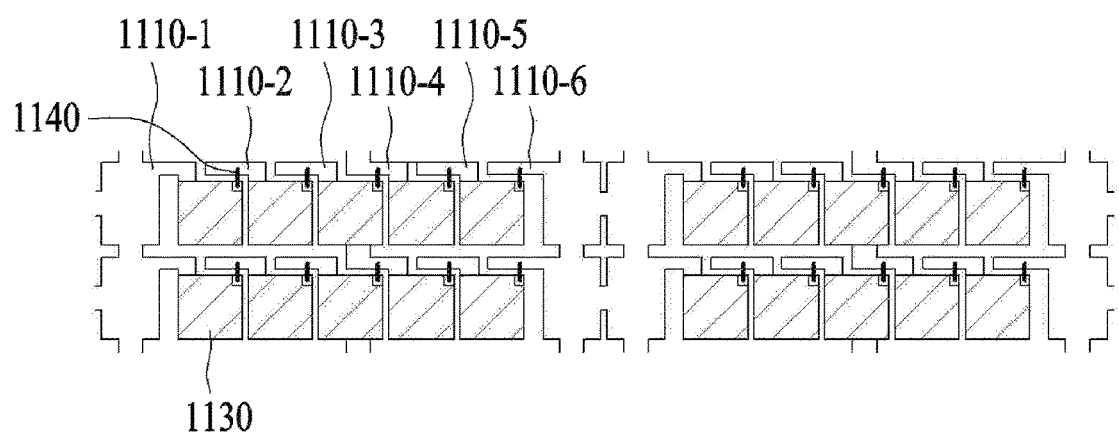

Thereafter, with reference to FIG. 13B, light emitting elements (not shown) are mounted on first parts P1 of corresponding lead frames of the lead frame pattern using die bonding.

One of each of the wires 1140 is bonded to each of electrode pads of the light emitting elements and the other end of each of the wires 140 is bonded to a second part P2 of the lead frame adjacent to the corresponding lead frame using wire bonding.

Thereafter, the phosphor plates 1130 are bonded to the upper surfaces of the respective light emitting elements using adhesive members. If the phosphor plates 1130 are already coated on the upper surfaces of the light emitting elements by conformal coating, a process of bonding the phosphor plates 1130 may be omitted.

Figure 13C:
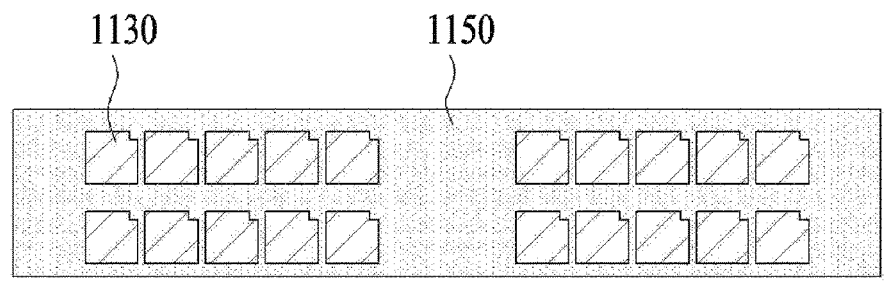

Thereafter, with reference to FIG. 13C, the resin layer 1150 is formed by injection molding using a mold. As a material for the resin layer 1150, the same material as that described in FIGS. 10 to 12 may be employed.

For example, a light emitting element package used in a general lighting apparatus or a vehicle lamp may use a white resin having high reflectivity, and a light emitting element packaged used in a head lamp or an electronic signboard requiring prevention of external reflection may use a black resin.

Figure 13D:
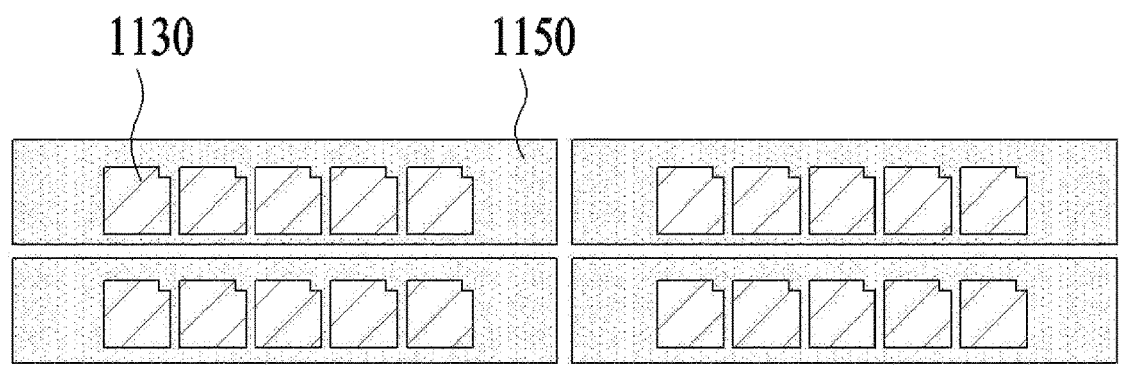

Thereafter, with reference to FIG. 13D, after molding of the resin layer 1150 has been completed, a dicing process to divide an array into individual light emitting element packages is executed. A light emitting element package acquired by the process of FIG. 13D may be the light emitting element package in accordance with the embodiment shown in FIG. 10.

Figure 14:
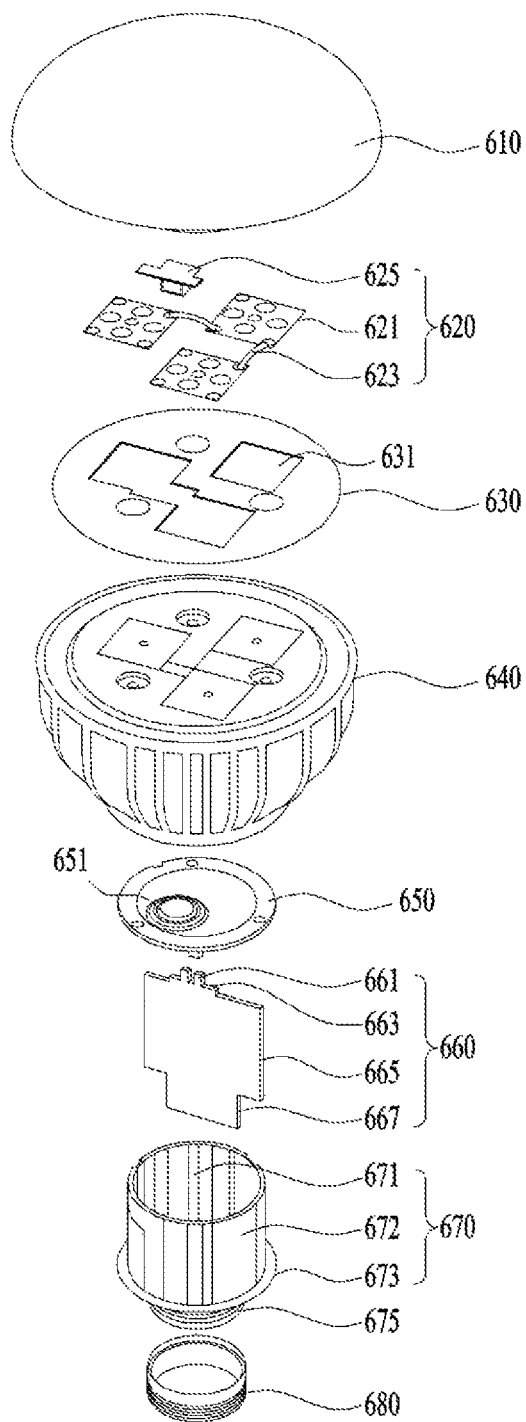
FIG. 14 is a view illustrating a lighting apparatus including light emitting element packages in accordance with one embodiment.

FIG. 14 is a view illustrating a lighting apparatus including light emitting element packages 100 to 300 in accordance with one embodiment.

With reference to FIG. 14, the lighting apparatus may include a cover 160, a light source module 620, a heat sink 640, a power supply unit 660, an inner case 670, and a socket 680. Further, the lighting apparatus in accordance with this embodiment may further include at least one of a member 630 and a holder 650.

The cover 160 may have a bulb or hemispheric shape which is hollow and is provided with one opened part. The cover 610 may be optically combined with the light source module 620. For example, the cover 610 may diffuse, scatter, or excite light supplied from the light source module 620. The cover 610 may be a kind of optical member. The cover 610 may be combined with the heat sink 640. The cover 610 may have a coupling part to be coupled with the heat sink 640.

The inner surface of the cover 610 may be coated with a milk-white paint. The milk-white paint may include a light diffuser to diffuse light. Surface roughness of the inner surface of the cover 610 may be greater than surface roughness of the outer surface of the cover 610. This serves to sufficiently scatter and diffuse light emitted from the light source module 620 and then to discharge the light to the outside.

The cover 610 may be formed of glass, plastic, polypropylene (PP), polyethylene (PE), polycarbonate (PC), etc. Here, polycarbonate (PC) has excellent light resistance, heat resistance, and strength. Although the cover 610 may be transparent so that the light source module 620 is visible from the outside, the disclosure is not limited thereto and the cover 610 may be opaque. The cover 610 may be formed by blow molding.

The light source module 620 may be disposed on one surface of the heat sink 640. Therefore, heat generated from the light source module 620 is conducted to the heat sink 640. The light source module 620 may include light source units 621, connection plates 623, and a connector 625.

The light source unit 621 may be at least one of the light emitting element packages 100 to 300 in accordance with the above-described embodiments.

The member 630 may be disposed on the upper surface of the heat sink 640, and include guide holes 631 into which the light source units 621 and the connector 625 are inserted. The guide holes 631 may correspond to or be aligned with substrates of the light source units 621 and the connector 625.

A light reflective material may be applied to or coated on the surface of the member 1300.

For example, a white paint may be applied to or coated on the surface of the member 630. The member 630 reflects light, reflected by the inner surface of the cover 610 and returning toward the light source module 620, to the cover 610. Therefore, the member 630 may enhance light efficiency of the lighting apparatus in accordance with this embodiment.

The member 630 may be formed of, for example, an insulating material. The connection plates 623 of the light source module 620 may include an electrically conductive material. Therefore, electrical contact between the heat sink 640 and the connection plates 623 may be carried out. The member 630 formed of an insulating material may prevent electrical short circuit between the connection plates 623 and the heat sink 640. The heat sink 640 receives heat from the light source module 620 and heat from the power supply unit 660, and dissipates the heat.

The holder 650 closes a reception hole 672 of an insulating part 671 of the inner case 670. Therefore, the power supply unit 660 received in the insulating part 671 of the inner case 670 is sealed. The holder 650 may have a guide protrusion 651, and the guide protrusion 651 may be provided with a hole through which protrusions 661 of the power supply unit 660 pass.

The power supply unit 660 processes or converts an electrical signal provided from the outside and then supplies the processed or converted electrical signal to the light source module 620. The power supply unit 660 may be received in the reception hole 672 of the inner case 670 and be sealed within the inner case 670 by the holder 650. The power supply unit 660 may include the protrusions 661, a guide part 663, a base 665, and an extension 667.

The guide part 663 may protrude from one side of the base 665 to the outside. The guide part 663 may be inserted into the holder 650. A plurality of elements may be disposed on one surface of the base 665. For example, the elements may include an AC/DC converter to convert AC power supplied from an external power source into DC power, a drive chip to control driving of the light source module 620, and an ElectroStatic discharge (ESD) protection element to protect the light source module 620, without being limited thereto.

The extension 667 may protrude from the other side of the base 665 to the outside. The extension 667 may be inserted into a connection part 675 of the inner case 670 and receive an electrical signal provided from the outside. For example, the extension 667 may have a width equal to or less than the width of the connection part 675 of the inner case 670. One end of each of a positive (+) electric wire and a negative (−) electric wire may be conductively connected to the extension 667, and the other end of each of the positive (+) electric wire and the negative (−) electric wire may be conductively connected to the socket 680.

The inner case 670 may include a molding part in addition to the power supply unit 660 therein. The molding part is formed by hardening a molding liquid and serves to fix the power supply unit 660 within the inner case 670.

Figure 15:
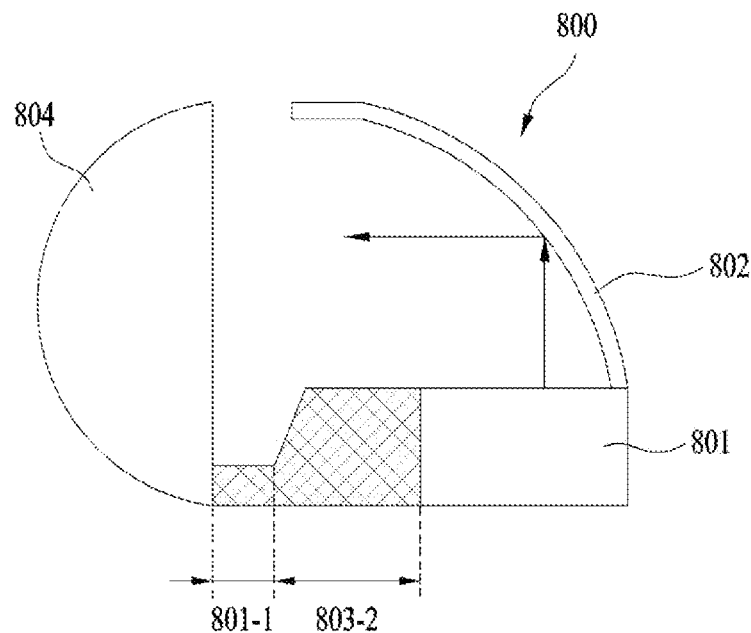
FIG. 15 is a view illustrating a vehicle head lamp in accordance with one embodiment.

FIG. 15 is a view illustrating a vehicle head lamp 800 in accordance with one embodiment.

With reference to FIG. 15, the head lamp 800 includes a lamp unit 801 including light emitting element packages, a reflector 802, a shade 803, and a lens 804.

The light emitting element package of the lamp unit 801 may be any one of the light emitting element packages 100 to 300 in accordance with the above-described embodiments.

The reflector 802 may reflect light, emitted from the lamp unit 801, in a designated direction. The shade 803 is a member which may be disposed between the reflector 802 and the lens 804 and intercept or reflect a part of light reflected by the reflector 802 and directed to the lens 804 so as to form a light distribution pattern desired by a designer.

Here, one side part 803-1 of the shade 803 adjacent to the lens 804 and the other side part 803-2 of the shade 803 adjacent to the lamp unit 801 may have different heights.

Light emitted from the lamp unit 801 may be reflected by the reflector 802 and the shade 803, pass through the lens 804, and travel in the forward direction of a vehicle. Here, the lens 804 may refract light, reflected by the reflector 802.

Figure 16:
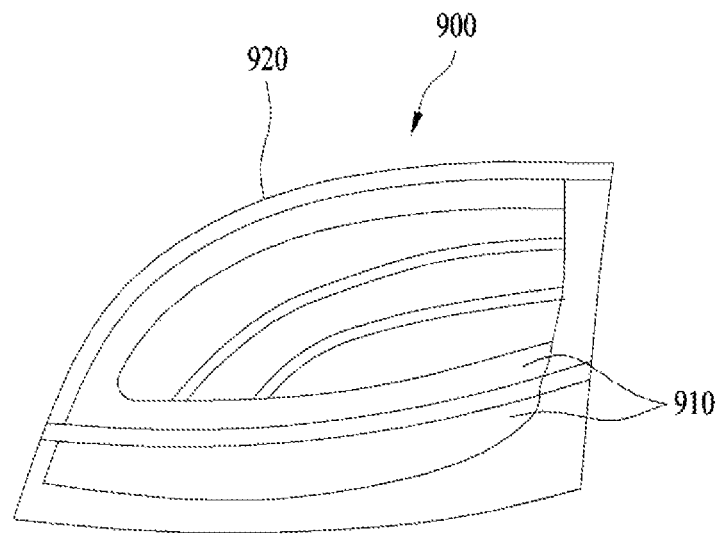
FIG. 16 is a view illustrating a vehicle head lamp in accordance with another embodiment.

FIG. 16 is a view illustrating a vehicle head lamp in accordance with another embodiment.

With reference to FIG. 16, the vehicle head lamp 900 may include lamp units 910 including light emitting element packages, and a light housing 920.

The lamp unit 910 may include at least one of the light emitting element packages 100 to 300 in accordance with the above-described embodiments.

The light housing 920 may accommodate the lamp units 910 and be formed of a light-transmitting material. The vehicle light housing 920 may include bent parts according to a region of a vehicle on which the light housing 920 is mounted, and a vehicle design.

The light emitting element packages in accordance with the embodiments may function as a light unit together with other optical members. Such a light unit may be provided to a display apparatus of a portable terminal or a notebook computer, or be applied to a lighting apparatus, indicating apparatus, etc. Further, in accordance with another embodiment, a lighting apparatus including the light emitting element packages in accordance with the above-described embodiments may be provided. For example, the lighting apparatus may include a lamp, a street lamp, an electronic signboard or a head lamp.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments are applicable to a lighting apparatus and a display apparatus.

The invention claimed is:
1. A light emitting element package comprising:
a substrate;
a conductive layer disposed on the substrate;
at least one light emitting chip disposed on the substrate;
a wavelength conversion unit disposed on an upper surface of the at least one light emitting chip and having a through hole;
a wire provided with a first end passing through the through hole and connected to the at least one light emitting chip and a second end connected to the conductive layer; and
a molding part disposed on the substrate so as to enclose the at least one light emitting chip and the wire and to expose an upper surface of the wavelength conversion unit,
wherein the wavelength conversion unit is spaced apart from the first end of the wire connected to the at least one light emitting chip, and
wherein the through hole has an opening opened to a side surface of the wavelength conversion unit,
wherein the molding part fills an inside of the through hole of the wavelength conversion unit,
wherein the molding part seals a first portion of the wire from the first end of the wire to a highest point of the wire,
wherein the first portion of the wire is disposed in the opening of the through hole, and the first portion of the wire sealed by molding part is located at a lower position than the upper surface of the wavelength conversion unit and an upper surface of the molding part, and wherein a distance from the upper surface of the at least one light emitting chip to the upper surface of the wavelength conversion unit is greater than a value acquired by adding 37 μm to a distance from the upper surface of the at least one light emitting chip to the highest point of the wire.

2. The light emitting element package according to claim 1, wherein the distance from the upper surface of the at least one light emitting chip to the upper surface of the wavelength conversion unit is greater than a distance from the upper surface of the at least one light emitting chip to an upper surface of the molding part.

3. The light emitting element package according to claim 1, wherein the distance from the upper surface of the at least one light emitting chip to the highest point of the wire is smaller than a distance from the upper surface of the at least one light emitting chip to an upper surface of the molding part.

4. The light emitting element package according to claim 1, wherein the molding part contacts a side surface of the wavelength conversion unit.

5. The light emitting element package according to claim 1, wherein the at least one light emitting chip comprises a pad part for connecting the first end of the wire, and the wavelength conversion unit is spaced apart from the pad part.

6. The light emitting element package according to claim 1, wherein the molding part contacts a corner part where the upper surface of the wavelength conversion unit and a side surface of the wavelength conversion unit meet.

7. The light emitting element package according to claim 1, wherein the molding part is spaced apart from a corner part where the upper surface of the wavelength conversion unit and a side surface of the wavelength conversion unit meet.

8. The light emitting element package according to claim 7, wherein the wavelength conversion unit protrudes from an upper surface of the molding part.

9. The light emitting element package according to claim 1, wherein the distance from the upper surface of the at least one light emitting chip to the highest point of the wire is 67 μm or more.

10. The light emitting element package according to claim 1, wherein the through hole is a hole passing through the upper surface of the wavelength conversion unit and a lower surface of the wavelength conversion unit.

11. The light emitting element package according to claim 1, wherein the molding part contacts the first portion of the wire, wherein a second portion of the wire from the highest point of the wire to the second end of the wire is sealed by the molding part, and wherein the second portion of the wire is located at a lower position than the upper surface of the molding part and the upper surface of the wavelength conversion unit.

12. A light emitting element package comprising:
a substrate;
a conductive layer disposed on the substrate;
at least one light emitting chip disposed on the substrate;
a wavelength conversion unit disposed on an upper surface of the at least one light emitting chip and having a through hole;

a wire provided with a first end passing through the through hole and connected to the at least one light emitting chip and a second end connected to the conductive layer; and a molding part disposed on the substrate so as to enclose the at least one light emitting chip and the wire, wherein the wavelength conversion unit is spaced apart from the first end of the wire connected to the at least one light emitting chip, and wherein the molding part contacts a side surface of the wavelength conversion unit and exposes an upper surface of the wavelength conversion unit, wherein the through hole has an opening opened to a side surface of the wavelength conversion unit, wherein the molding part fills an inside of the through hole of the wavelength conversion unit, wherein the molding part seals a first portion of the wire from the first end of the wire to a highest point of the wire, wherein the first portion of the wire is disposed in the opening of the through hole, and the first portion of the wire sealed by molding part is located at a lower position than the upper surface of the wavelength conversion unit and an upper surface of the molding part.

13. The light emitting element package according to claim 12, wherein a distance from the upper surface of the at least one light emitting chip to the upper surface of the wavelength conversion unit is greater than a value acquired by adding 37 μm to a distance from the upper surface of the at least one light emitting chip to the highest point of the wire.

14. The light emitting element package according to claim 12, wherein the molding part contacts the first portion of the wire.

15. The light emitting element package according to claim 12, wherein the through hole is a hole passing through an upper surface of the wavelength conversion unit and a lower surface of the wavelength conversion unit.

16. A light emitting element package comprising:
lead frames spaced apart from each other;
light emitting elements disposed on the lead frames, wherein each of the light emitting elements is disposed on an upper surface of a corresponding one of the lead frames;
phosphor plates disposed on the light emitting elements, wherein each of the phosphor plates is disposed on an upper surface of a corresponding one of the light emitting elements;
wires configured to conductively connect the light emitting elements and the lead frames; and
a resin layer configured to enclose the lead frames, the light emitting elements, the phosphor plates and at least parts of the wires,
wherein each of the phosphor plates includes a through hole, and a first end of each of the wires passes through the through hole of a corresponding one of the phosphor plates,
wherein the first end of each of the wires is spaced apart from the corresponding one of the phosphor plates, and
wherein the resin layer exposes upper surfaces of the phosphor plates, contacts side surfaces of the phosphor plates, is disposed between side surfaces of the lead frames and contacts the side surfaces of the lead frames,
wherein the through hole has an opening opened to a side surface of each of the phosphor plates,
wherein the resin layer fills an inside of the through hole, wherein the resin layer seals a first portion of each of the wires from the first end of each of the wires to a highest point of each of the wires, wherein the first portion of each of the wires is disposed in the opening of the through hole, and the first portion of each of the wires sealed by resin layer is located at a lower position than the upper surfaces of the phosphor plates and an upper surface of the resin layer.

17. The light emitting element package according to claim 16, wherein the resin layer exposes lower surfaces of the lead frames.

18. The light emitting element package according to claim 16, wherein a height of the upper surface of the resin layer is greater than a height of the highest point of each of the wires.

19. The light emitting element package according to claim 16, wherein a distance from the upper surface of each of the light emitting elements to the upper surface of the resin layer is the same as a distance from the upper surface of each of the light emitting element to the upper surface of each of the phosphor plates.

20. The light emitting element package according to claim 16, wherein the resin layer is formed of a black resin, Polyphthalamide (PPA) resin mixed with carbon black, black Epoxy Molding compound (EMC) resin or black silicone.

* * * * *